(12) United States Patent
Wu et al.

(10) Patent No.: US 11,581,751 B2
(45) Date of Patent: Feb. 14, 2023

(54) POWER CONTROL METHOD AND RELATED CHARGING SYSTEM

(71) Applicant: Wistron Corporation, New Taipei (TW)

(72) Inventors: Chih-Jen Wu, New Taipei (TW); Chih-Wen Huang, New Taipei (TW); Li-Ping Pan, New Taipei (TW)

(73) Assignee: Wistron Corporation, New Taipei (TW)

( * ) Notice: Subject to any disclaimer, the term of this patent is extended or adjusted under 35 U.S.C. 154(b) by 295 days.

(21) Appl. No.: 16/748,773

(22) Filed: Jan. 21, 2020

(65) Prior Publication Data

US 2021/0111566 A1 Apr. 15, 2021

(30) Foreign Application Priority Data

Oct. 14, 2019 (TW) ................................. 108136932

(51) Int. Cl.
*H03F 3/20* (2006.01)
*H02J 7/00* (2006.01)
*H04R 3/00* (2006.01)

(52) U.S. Cl.
CPC ................ *H02J 7/007* (2013.01); *H03F 3/20* (2013.01); *H03F 2200/03* (2013.01); *H04R 3/00* (2013.01)

(58) Field of Classification Search
CPC . H02J 7/007; H02J 7/0068; H02J 7/04; H03F 3/20; H03F 2200/03; H03F 2200/321; H03F 1/0211; H03F 3/181; H04R 3/00
USPC .............................................. 330/298, 207 P
See application file for complete search history.

(56) References Cited

U.S. PATENT DOCUMENTS

| | | | |
|---|---|---|---|
| 8,188,706 B2 * | 5/2012 | Yang ...................... | H02J 7/0068 320/107 |
| 9,104,212 B2 * | 8/2015 | Wei .......................... | G05F 5/00 |
| 10,747,284 B2 * | 8/2020 | Koki ..................... | G06F 1/1669 |

FOREIGN PATENT DOCUMENTS

| CN | 207530600 U | 6/2018 |
|---|---|---|
| CN | 108667471 A | 10/2018 |
| CN | 110165745 A | 8/2019 |
| TW | 201710831 A | 3/2017 |

* cited by examiner

*Primary Examiner* — Hieu P Nguyen
(74) *Attorney, Agent, or Firm* — Winston Hsu

(57) ABSTRACT

A power control method for a charging system includes: detecting a power signal and an input voltage of the power signal; determining a charging protocol supported by the power signal; and determining whether to conduct a power switching circuit or not according to the input voltage of the power signal and the charging protocol supported by the power signal to provide power for an amplifier chip of the charging system.

14 Claims, 4 Drawing Sheets

POWER CONTROL METHOD AND RELATED CHARGING SYSTEM

BACKGROUND OF THE INVENTION

1. Field of the Invention

The present invention relates to a power control method and a related charging system, and more particularly, to a power control method and a related charging system capable of enhancing a power utilization efficiency and an output power of an output device.

2. Description of the Prior Art

Ina conventional charging circuit for a player/speaker, since a voltage transformed by a boosting transformer in the charging circuit is fixed, a power source of the boosting transformer is fixed at a maximal output power. Since, however, an input voltage of a conventional transformer is variable (e.g. a transformer qualified for power delivery (PD) charging protocol providing a voltage of 5V/9V/15V/20V, or a transformer qualified for quick charge (QC) charging protocol providing voltages from 3.6 to 20V), when the input voltage of the transformer in the charging circuit is varied, the maximal output power of the player/speaker is constrained to the boosting transformer of the charging circuit, since the voltage transformed by the boosting transformer of the charging circuit is fixed. In addition, a transformation efficiency of the boosting transformer of the charging circuit is reduced due to heat dissipation when transforming the power source, which increases a temperature of the charging circuit. Therefore, the conventional technique requires improvements.

SUMMARY OF THE INVENTION

The present invention provides a power control method and a related charging system to enhance a power utilization efficiency of the charging circuit and an output power of an output device to improve upon the conventional technique.

An embodiment of the present invention discloses a power control method for a charging system, comprises detecting a power signal and an input voltage of the power signal; determining a charging protocol supported by the power signal; and determining whether to conduct a power switching circuit or not according to the input voltage of the power signal and the charging protocol supported by the power signal to provide power for an amplifier chip of the charging system.

Another embodiment of the present invention discloses a charging system, comprises a charging circuit, configured to receive a power signal from a transformer to detect an input voltage of the power signal to determine a charging protocol supported by the power signal; a power switching circuit, coupled to the charging circuit, configured to receive the power signal of the transformer; and a microcontroller, coupled to the charging circuit and the power switching circuit, configured to read the power signal detected by the charging circuit, the input voltage and the charging protocol supported by the power signal, so as to determine whether to conduct a power switching circuit or not to provide power for an amplifier chip of the charging system.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
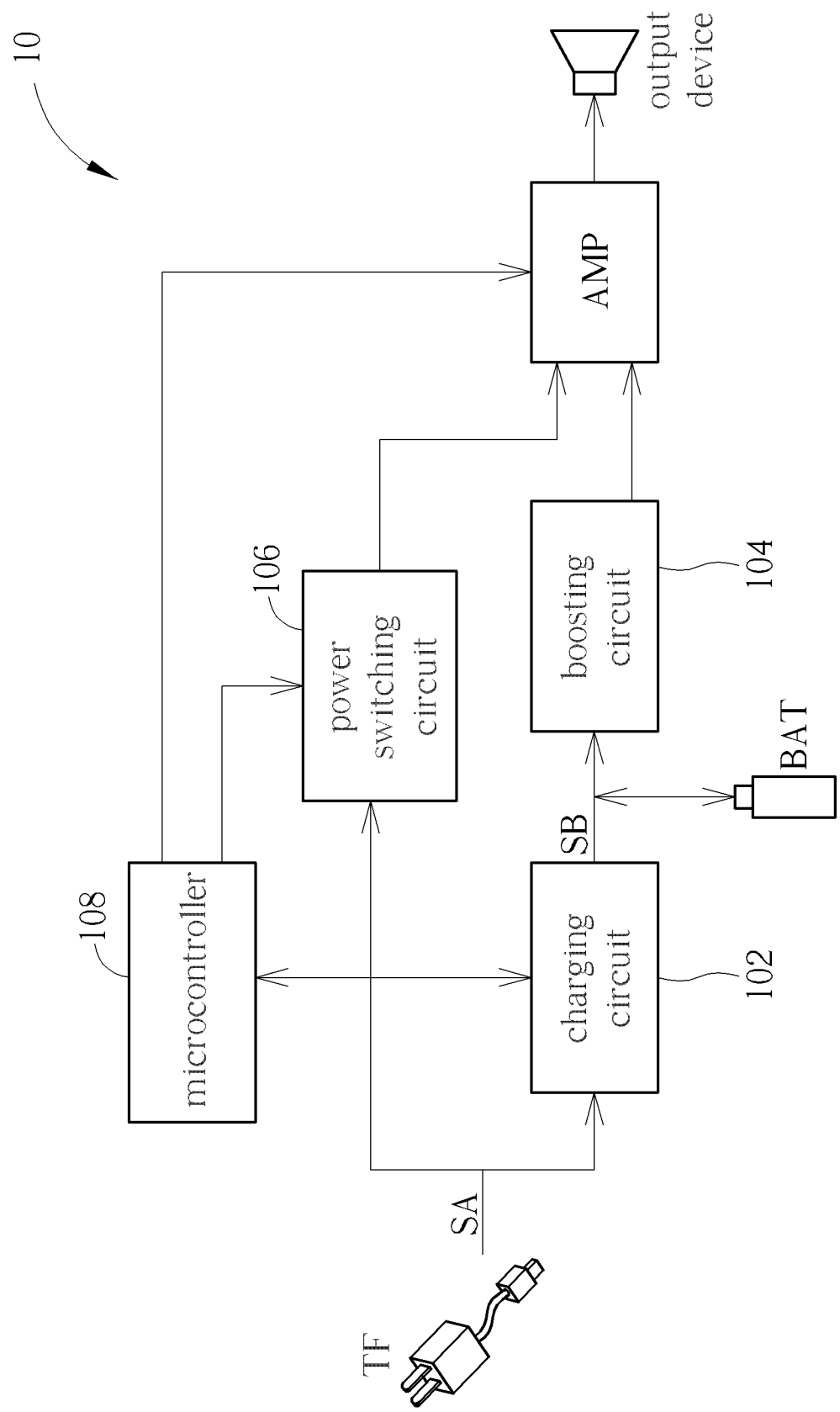
FIG. 1 is a schematic diagram of a charging system according to an embodiment of the present invention.

Refer to FIG. 1, which is a schematic diagram of a charging system 10 according to an embodiment of the present invention. The charging system 10 includes a charging circuit 102, a charging battery BAT, a boosting circuit 104, a power switching circuit 106, a microcontroller 108 and an amplifier chip AMP. The charging circuit 102 is configured to receive a power signal SA of a transformer TF to detect an input voltage of the power signal SA, so as to determine a charging protocol supported by the power signal SA. For example, the power signal SA may be a power signal qualified for a Power Delivery (PD) charging protocol or a Quick Charge (QC) charging protocol, i.e. the transformer TF according to an embodiment of the present invention may be a PD/QC 3.0 transformer to provide the power signal. Thus, when the charging circuit 102 detects the power signal SA from the transformer TF, the charging circuit 102 may read a setting profile of the power signal SA, the input voltage and the supported charging protocol. The charging battery BAT is configured to receive a power signal SB outputted by the charging circuit 102 to store electric energy. The boosting circuit 104 is coupled to the charging circuit 102 and the charging battery BAT and is configured to transform the received power signal SB to drive the amplifier chip AMP. The power switching circuit 106 is parallel to the charging circuit 102 and the boosting circuit 104, and is configured to receive the power signal SA of the transformer TF. The microcontroller 108 may be a computer motherboard, coupled to the charging circuit 102, the power switching circuit 106 and the amplifier chip AMP, and may be configured to read the power signal SA detected by the charging circuit 102, the input voltage and the charging protocol supported by the power signal SA, so as to determine whether or not to conduct the power switching circuit 106 in order to provide power for the amplifier chip AMP of the charging system 10. The amplifier chip AMP is configured to drive and connect an output device, e.g. a speaker. In an embodiment of the present invention, the microcontroller 108 is configured to constantly perform polling for the charging circuit 102 to determine whether the transformer TF is connected or not, and to determine the power signal, the input voltage and the supported charging protocol when the charging circuit 102 is connected to the transformer TF. Therefore, the microcontroller 108 of the charging system 10 of the present invention may switch the power switching circuit 106 according to different power signals of the transformer TF to provide the power for the amplifier chip AMP, to thereby increase a power utilization efficiency of the charging system 10.

Figure 2:
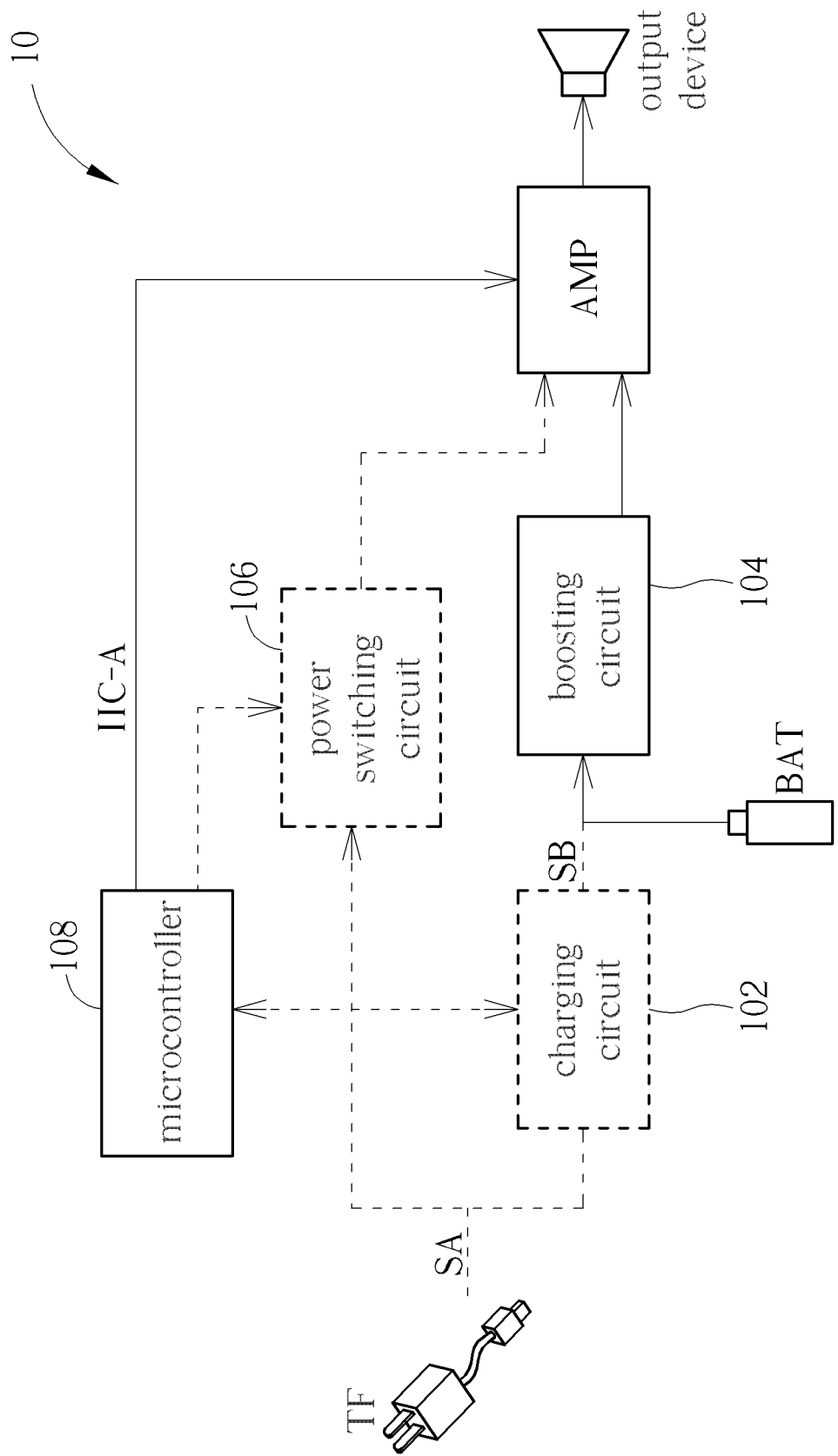
FIG. 2 is a schematic diagram of no transformer being connected to the charging system according to an embodiment of the present invention.

In detail, when the charging system 10 is not connected to any transformer, the charging battery BAT provides the power for the boosting circuit 104, and is taken as the power for the amplifier chip AMP. FIG. 2 is a schematic diagram of no transformer being connected to the charging system 10 according to an embodiment of the present invention. Under this situation, the microcontroller 108 controls parameters of the amplifier chip AMP via a bus IIC-A, e.g. a volume curve and/or a gain parameter of the amplifier chip AMP, to adjust a maximal output power of the amplifier chip AMP.

Figure 3:
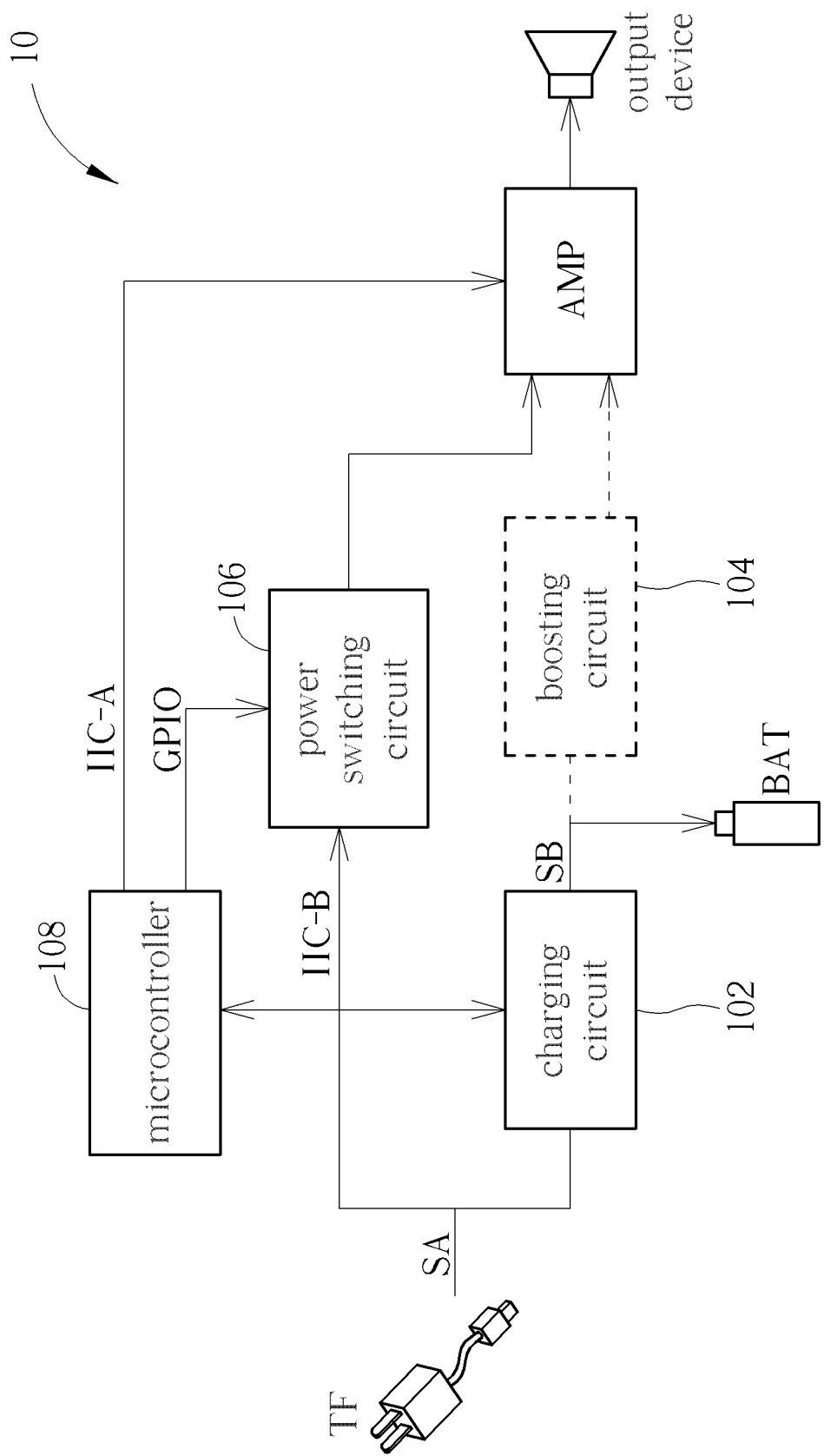
FIG. 3 is a schematic diagram of a transformer being connected to the charging system according to an embodiment of the present invention.

The charging system 10 may be connected to the transformer TF as shown in FIG. 3, which is a schematic diagram of the transformer TF being connected to the charging system 10 according to an embodiment of the present invention. The microcontroller 108 reads a status of the charging circuit 102 via a bus IIC-B to obtain the power signal, the input voltage and the supported charging protocol of the transformer TF. In an embodiment, the charging circuit 102 may read a setting profile or a power delivery object (PDO) of the connected transformer TF to determine the input voltage or other status of the PD charging protocol or the QC charging protocol. The microcontroller 108 may thereby determine whether the power signal SA of the transformer TF is qualified for the PD charging protocol or the QC 3.0 charging protocol via the bus IIC-B, and may further read the input voltage of the PD charging protocol (i.e. 5V/9V/15V/20V) or the QC 3.0 charging protocol, so as to determine whether or not to conduct the power switching circuit 106 in order to provide power for the amplifier chip AMP of the charging system 10.

For example, when the charging battery BAT of the charging system 10 is a 4.2V 18650 rechargeable lithium battery, and the input voltage of the power signal SA read by the microcontroller 108 is larger than or equal to a boosting voltage of the boosting circuit 104, the microcontroller 108 conducts the power switching circuit 106 via a general-purpose input/output (GPIO), and outputs the power signal SA to the amplifier chip AMP. The microcontroller 108 may load the corresponding parameters of the amplifier chip AMP via the bus IIC-A according to the charging protocol supported by the power signal, for enhancing the volume curve and/or gain of the amplifier chip AMP. In addition, in the above embodiment, since the microcontroller 108 conducts the power switching circuit 106 and the power signal SA is transmitted to the amplifier chip AMP, the power signal SA bypasses the boosting circuit 104, decreasing heat dissipation generated by the boosting circuit 104 when transforming voltage and increasing the power utilization efficiency of the charging system 10.

In contrast, when the input voltage of the power signal SA read by the microcontroller 108 is smaller than the boosting voltage of the boosting circuit 104, the microcontroller 108 does not conduct the power switching circuit 106, and the charging circuit 102 provides power for the amplifier chip AMP via the boosting circuit 104, or the charging circuit 102 charges the charging battery BAT.

Notably, the power switching circuit 106 of the charging system 10 is parallel to the boosting circuit 104, and a diode is coupled to an output terminal of the boosting circuit 104. Therefore, when the input voltage of the power signal SA read by the microcontroller 108 is larger than or equal to the boosting voltage of the boosting circuit 104, the power signal SA is transmitted to the amplifier chip AMP via the power switching circuit 106. Since the output terminal of the boosting circuit 104 is protected by the diode, a circumstance of current conflict or reverse current is avoided. In this way, the charging circuit 102 may effectively charge the charging battery BAT with the power signal SA.

Based on different applications and design concepts, the charging system 10 according to an embodiment of the present invention may be implemented using many methods. For example, the diode for avoiding the current conflict of the boosting circuit 104 and the power switching circuit 106 may be implemented by other switches, which are all applicable to the present invention, and not limited thereto.

Figure 4:
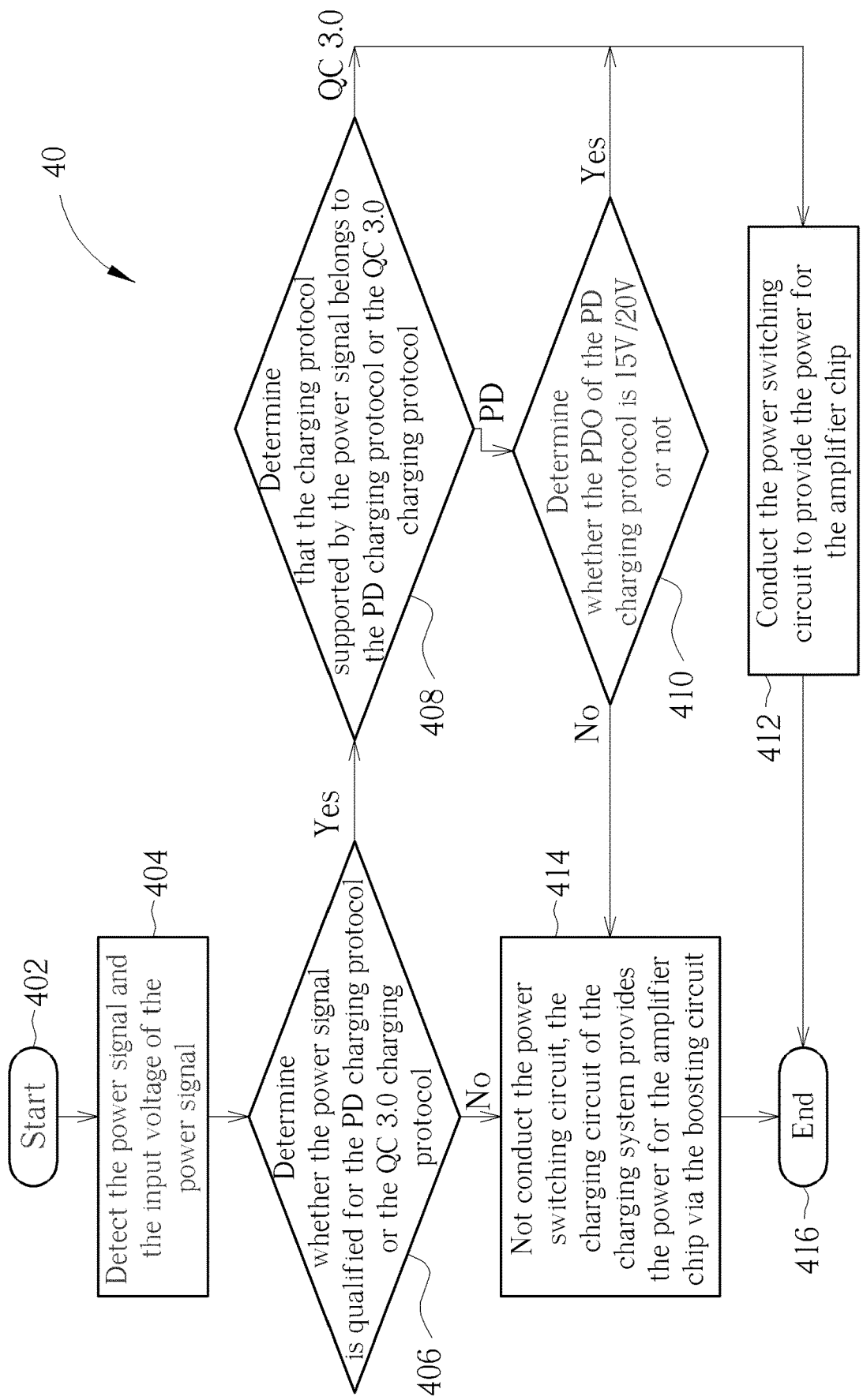
FIG. 4 is a schematic diagram of a control process according to an embodiment of the present invention.

Further, when the charging system 10 is connected to the transformer TF, an operation method of the charging system 10 may be summarized as a control process 40 shown in FIG. 4. The control process 40 includes the following steps:

Step 402: Start.

Step 404: Detect the power signal and the input voltage of the power signal.

Step 406: Determine whether the power signal is qualified for the PD charging protocol or the QC 3.0 charging protocol. If yes, execute step 408; if no, execute step 414.

Step 408: Determine that the charging protocol supported by the power signal belongs to the PD charging protocol or the QC 3.0 charging protocol. If the charging protocol supported by the power signal is qualified for the PD charging protocol, execute step 410; if the charging protocol supported by the power signal is qualified for the QC 3.0 charging protocol, execute step 412.

Step 410: Determine whether the PDO of the PD charging protocol is 15V/20V or not. If yes, execute step 412; if no, execute step 414.

Step 412: Conduct the power switching circuit to provide the power for the amplifier chip.

Step 414: Not conduct the power switching circuit, the charging circuit of the charging system provides the power for the amplifier chip via the boosting circuit.

Step 416: End.

Regarding the operation of the control process 40, assume that the power signal SA after the boosting circuit 104 is 12V. In step 404, when the transformer TF is inserted to the charging system 10 to play music, i.e. the power signal is inputted into the charging system, the charging circuit 102 detects the power signal SA and the input voltage of the power signal SA. In step 406, the charging circuit 102 determines whether the power signal SA is qualified for one of the PD charging protocol and QC 3.0 charging protocol. If yes, the process goes to step 408 to determine which of the PD charging protocol or the QC 3.0 charging protocol the power signal SA is qualified for. In other words, the power signal SA, which is not qualified for the PD charging protocol or the QC 3.0 charging protocol is excluded in step 406, and then the charging protocol (i.e. the PD charging protocol or the QC 3.0 charging protocol) supported by the power signal SA is further determined in step 408. In contrast, when the charging circuit 102 is determined as not qualified for the PD charging protocol or QC 3.0 charging protocol in step 406, the process goes to step 414.

When the charging circuit 102 determines that the power signal SA supports the QC 3.0 charging protocol in step 408, i.e. the input voltage supported by the QC 3.0 charging protocol is larger than the boosting voltage of the boosting circuit 104, the process goes to step 412, and the microcontroller 108 conducts the power switching circuit 106 to provide power for the amplifier chip AMP. When the charging circuit 102 determines that the power signal SA supports the PD charging protocol in step 408, then the process goes to step 410 to determine whether the PDO of the PD charging protocol is 15V/20V. When the PDO of the PD charging protocol read by the charging circuit 102 is 15V/

20V, the input voltage is larger than or equal to the boosting voltage of the boosting circuit 104. Thus, the microcontroller 108 conducts the power switching circuit 106 accordingly in step 412 to provide power for the amplifier chip AMP. In contrast, when the PDO of the PD charging protocol read by the charging circuit 102 is not 15V/20V, the input voltage is smaller than the boosting voltage of the boosting circuit 104. Thus, the microcontroller 108 does not conduct the power switching circuit 106 in step 414, and the charging circuit 102 of the charging system 10 provides power for the amplifier chip AMP via the boosting circuit 104. In this way, the charging system 10 of the present invention may switch the power switching circuit 106 according to different power signals of the transformer TF to provide power for the amplifier chip AMP so as to enhance the power utilization efficiency of the charging system 10.

In summary, the present invention provides a power control method and a related charging system, which switches a power signal to bypass a boosting circuit by a power switching circuit to decrease a heat dissipation of the boosting circuit when transforming voltage, enhance a power utilization efficiency, and improve a maximal output power of an output device when connected to the charging system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power control method for a charging system, comprising:
    detecting a power signal and an input voltage of the power signal;
    determining a charging protocol supported by the power signal; and
    determining whether to conduct a power switching circuit or not according to the input voltage of the power signal and the charging protocol supported by the power signal to provide power for an amplifier chip of the charging system;
    wherein the power switching circuit is parallel to a boosting circuit.

2. The power control method of claim 1, wherein the power signal is qualified for a power delivery (PD) charging protocol or a quick charge (QC) charging protocol.

3. The power control method of claim 2, wherein the step of determining whether to conduct the power switching circuit or not according to the input voltage of the power signal and the charging protocol supported by the power signal comprises:
    when the power signal is qualified for the QC charging protocol, conducting the power switching circuit to provide the power for the amplifier chip of the charging system.

4. The power control method of claim 2, wherein the step of determining whether to conduct the power switching circuit or not according to the input voltage of the power signal and the charging protocol supported by the power signal comprises:
    comparing a first input voltage of the power signal and a boosting voltage of the boosting circuit of the charging system when the power signal is qualified for the PD charging protocol; and
    not conducting the power switching circuit when the first input voltage is smaller than the boosting voltage, a charging circuit of the charging system providing the power for the amplifier chip via the boosting circuit; or
    conducting the power switching circuit when the first input voltage is larger than or equal to the boosting voltage.

5. The power control method of claim 2, further comprising:
    loading parameters of the amplifier chip according to the charging protocol supported by the power signal to change a volume curve and/or a gain of the amplifier chip.

6. The power control method of claim 2, wherein when no power signal is detected, a charging battery of the charging system provides the power for the amplifier chip via the boosting circuit.

7. The power control method of claim 6, wherein a diode is coupled to an output terminal of the boosting circuit.

8. A charging system, comprising:
    a charging circuit, configured to receive a power signal from a transformer to detect an input voltage of the power signal to determine a charging protocol supported by the power signal;
    a power switching circuit, coupled to the charging circuit, configured to receive the power signal of the transformer; and
    a microcontroller, coupled to the charging circuit and the power switching circuit, configured to read the power signal detected by the charging circuit, the input voltage and the charging protocol supported by the power signal, to determine whether to conduct a power switching circuit or not to provide power for an amplifier chip of the charging system;
    wherein the power switching circuit is parallel to a boosting circuit.

9. The charging system of claim 8, wherein the power signal is qualified for a power delivery (PD) charging protocol or a quick charge (QC) charging protocol.

10. The charging system of claim 9, wherein when the charging circuit determines that the power signal is qualified for the QC charging protocol, the microcontroller conducts the power switching circuit to provide the power for the amplifier chip of the charging system.

11. The charging system of claim 9, wherein the charging circuit compares a first input voltage of the power signal and a boosting voltage of the boosting circuit of the charging system when the power signal is qualified for the PD charging protocol, the microcontroller does not conduct the power switching circuit when the first input voltage is smaller than the boosting voltage, a charging circuit of the charging system provides the power for the amplifier chip via the boosting circuit; or the microcontroller conducts the power switching circuit when the first input voltage is larger than or equal to the boosting voltage.

12. The charging system of claim 9, wherein the microcontroller is further configured to load parameters of the amplifier chip according to the charging protocol supported by the power signal to change a volume curve and/or a gain of the amplifier chip.

13. The charging system of claim 9, wherein when no power signal is detected, a charging battery of the charging system provides the power for the amplifier chip via the boosting circuit.

14. The charging system of claim 13, wherein a diode is coupled to an output terminal of the boosting circuit.

* * * * *